United States Patent [19]

Brown et al.

[11] Patent Number: 5,452,325

[45] Date of Patent: Sep. 19, 1995

[54] AVERAGING ZERO PHASE START FOR PHASE LOCKED LOOPS

[75] Inventors: Russell W. Brown, Nepean, Canada; Toai A. Doan, West Hills, Calif.; Edward L. Henderson, Kanata, Canada

[73] Assignee: Quantum Corp., Milpitas, Calif.

[21] Appl. No.: 90,378

[22] Filed: Jul. 12, 1993

[51] Int. Cl.⁶ ............... G11B 5/09; H03K 5/00; H03K 5/13; H03D 3/24
[52] U.S. Cl. ................. 375/376; 375/374; 360/51; 327/231
[58] Field of Search ............ 375/120; 328/73, 133, 328/155, 511; 307/511; 360/51; 327/231

[56] References Cited

U.S. PATENT DOCUMENTS

| | | | |
|---|---|---|---|
| 4,560,950 | 12/1985 | Cabot | 331/1 A |
| 4,908,841 | 3/1990 | Leis et al. | 375/81 |
| 5,121,085 | 6/1992 | Brown | 331/8 |
| 5,170,297 | 12/1992 | Wahler et al. | 360/51 |
| 5,258,933 | 11/1993 | Johnson et al. | 364/602 |
| 5,272,730 | 12/1993 | Clark | 360/51 |
| 5,285,483 | 2/1994 | Ogawa et al. | 375/120 |
| 5,297,172 | 3/1994 | Shenoy et al. | 375/120 |

OTHER PUBLICATIONS

F. M. Gardner, "Charge-pump phase-lock loops," IEEE Transactions on Communications, vol. Com-28, No. 11, pp. 1849-1858, Nov. 1980.

F. M. Gardner, "Hangup in phase-lock loops," IEEE Transactions on Communications, vol. Com-25, No. 10, pp. 1210-1214, Oct. 1977.

Primary Examiner—Stephen Chin
Assistant Examiner—Timothy J. May
Attorney, Agent, or Firm—David B. Harrison

[57] ABSTRACT

A phase locked loop has an average zero phase start circuit to detect and correct for the average phase difference between a data signal and a VCO clock signal over a short interval at the beginning of phase-lock acquisition. The average zero phase start circuit has a data comparator to split the data stream into odd and even portions; odd and even pulse position detectors to detect the phase difference between pulses of the odd and even data signals and corresponding pulses of the VCO clock; and a ramp generator to generate a voltage corresponding to the sum of the detected phase differences. The ramp generator employs a capacitor and switched current sources that discharge the capacitor at a fixed rate to generate the voltage. After 4 phase difference measurements are taken, the VCO is stopped, and another current source discharges the capacitor at 4 times the fixed rate. A ramp comparator indicates when the capacitor voltage converges with a reference voltage to restart the VCO in the desired phase alignment with the data signal.

5 Claims, 4 Drawing Sheets

AVERAGING ZERO PHASE START FOR PHASE LOCKED LOOPS

FIELD OF THE INVENTION

The invention relates to the field of digital phase locked loops, and more particularly to phase locked loops used to derive a clock from an intermittent data signal.

BACKGROUND OF THE INVENTION

Phase locked loops are commonly used to derive from a serial data signal a clock that is to be used for sampling and other processing of the data signal. An example of such a use is given in U.S. Pat. No. 4,908,841 issued Mar. 13, 1990 to Leis et al, entitled "Data Decoding Circuit Including Phase-Locked Loop Timing".

In many applications, including data storage applications such as described in the Leis patent, the data stream is intermittent rather than continuous. This intermittent nature of the data places special demands on the phase locked loop. Whenever a new burst of data is received, such as after a seek or head switch in a data storage device, the system must wait for the phase locked loop to acquire phase lock before the data can be sampled. This of course has the effect of increasing data latency. Phase locked loop acquisition time is therefore an important factor affecting system performance.

In addition, phase lock acquisition occurs when a special magnetic pattern called a preamble is passing under the readback head in the data storage device. A longer acquisition time demands a longer preamble stored on the medium, reducing the amount of space available for user data.

It is therefore desirable to minimize phase locked loop acquisition time for performance and capacity reasons. However, it is known that phase locked loops can exhibit unacceptably long acquisition times, and even fail to lock within a predetermined maximum time under some circumstances. The nature of these problems is described in an article by Floyd M. Gardner entitled "Hangup in Phase-Lock Loops", IEEE Transactions on Communications, Vol. COM-25, No. 10, October 1977. This article points out that acquisition may start around a "reverse-slope null", i.e., a point where the initial phase difference is halfway between two stable phase-locked operating points. In such cases, acquisition may take numerous cycles. And as Gardner points out, the presence of noise in the data signal can actually exacerbate these problems.

A general technique used to avoid long acquisition time is to apply a large initial correction to the voltage-controlled oscillator (VCO) to rapidly bring its phase close to that of the data signal. Subsequent phase locking presumably then proceeds more rapidly; also, the reverse-slope null is avoided. The amount of correction to be applied is determined by sampling the data-to-clock phase difference at the beginning of acquisition. The above-referenced Gardner article describes a scheme employing this general idea.

A variation of this scheme, commonly called "zero-phase start", has been widely used in digital phase locked loops. In this approach, the initial data-to-clock phase difference is measured, and the result is used to stop the VCO for sufficient time to correct for this phase difference. Examples of this scheme can be found in U.S. Pat. No. 5,170,297 issued Dec. 8, 1992 to Wahler et al., entitled "Current Averaging Data Separator", and U.S. Pat. No. 4,560,950 issued Dec. 24, 1985 to Cabot, entitled "Method and Circuit for Phase Lock Loop Initialization".

While these zero phase start schemes improve the acquisition times of their associated phase locked loops, they nevertheless suffer from one of the very problems giving rise to their use, namely noise. Noise appearing on the data signal can contribute to an inaccurate initial measurement. This of course could result in an inaccurate initial phase correction, and may actually increase rather than decrease acquisition time. In fact, there is a particular type of noise, commonly called "pulse pairing" noise in data storage systems, that limits the effectiveness of these zero phase start schemes. When pulse pairing occurs, adjacent pulses have alternating early/late phase errors. However, conventional zero phase start schemes that rely on a single initial measurement do not detect or compensate for such correlated noise.

SUMMARY OF THE INVENTION

It is accordingly an object of the present invention to improve phase locked loop acquisition in the presence of noise, particularly pulse pairing noise.

The present invention generally includes a pulse position detector to detect the phase difference between data pulses and clock pulses, and an averaging circuit to determine the average amount of phase difference over several pulses. This average value is then used to stop a VCO for sufficient time to correct for this average phase error. Preferably averaging takes place over an even number of pulses, thereby diminishing the effect of pulse pairing noise.

In a preferred embodiment of the invention, an averaging zero phase start circuit has a data comparator to split the data signal into odd and even portions, and also has independent odd and even pulse position detectors. The measured phase difference between data and clock is indicated by the pulse widths of the output signals of the pulse position detectors. These signals feed a ramp generator circuit that measures the phase differences by discharging a capacitor at a fixed rate when the signals are asserted. A counter is used to stop averaging after 4 pulses, at which time the VCO is stopped. Then the capacitor is discharged at 4 times the fixed rate. A comparator detects when the capacitor voltage has crossed a reference voltage, at which time the VCO is re-started in correct phase alignment with the data signal.

Overall, the invention achieves better noise performance by finding an average phase difference rather than an instantaneous one; and in particular compensates for pulse pairing noise by averaging over an even number of pulses. Additionally, splitting the data signal into odd and even portions contributes to accurate phase difference measurements without requiring exceptionally fast front-end hardware. The averaging scheme employed is also particularly suitable for use in an integrated circuit. Other advantages of the present invention will be apparent to those skilled in the art in light of the detailed description below.

BRIEF DESCRIPTION OF THE DRAWINGS

An embodiment of the invention will be described with reference to the accompanying drawings, in which.

DESCRIPTION OF THE PREFERRED EMBODIMENT

Figure 1:
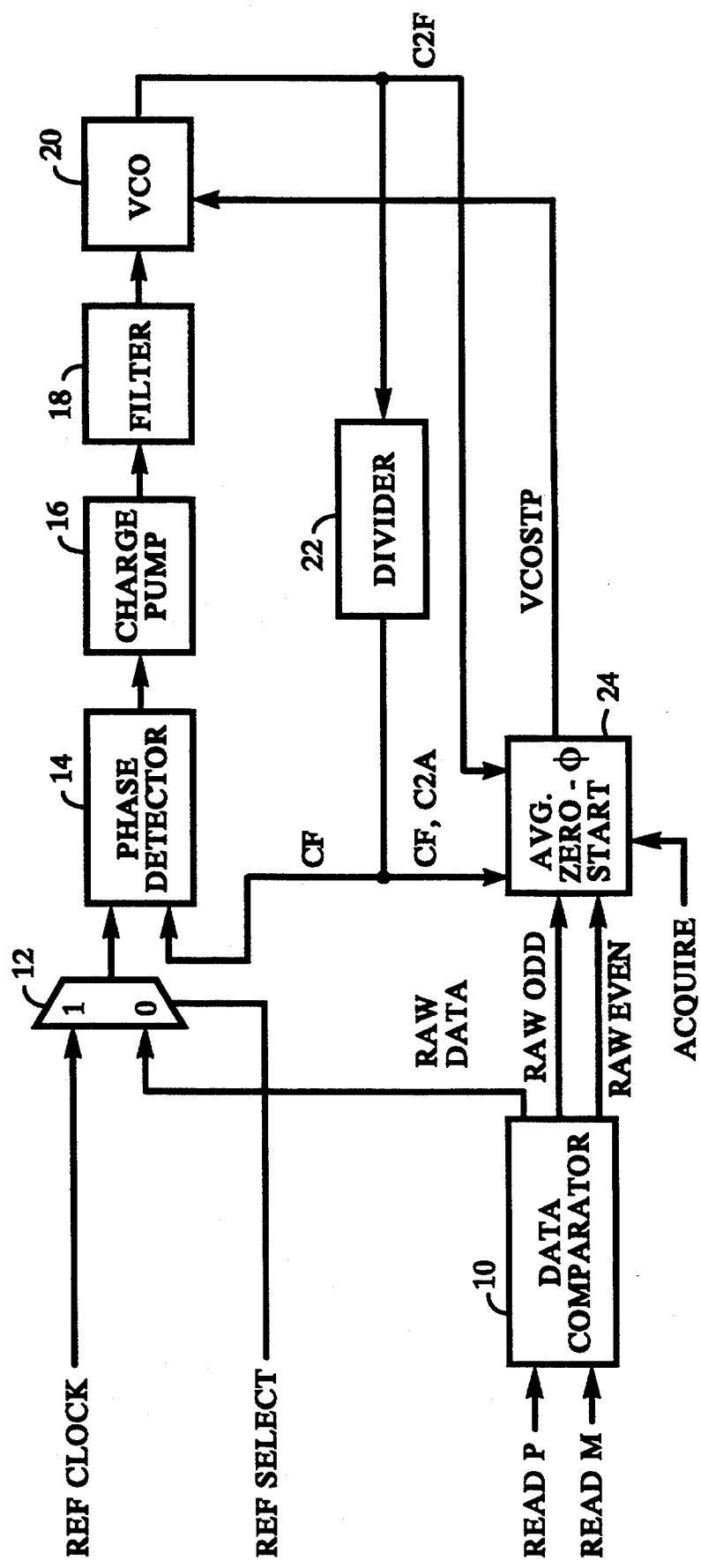
FIG. 1 is a block diagram of a phase locked loop according to the principles of the invention.

In FIG. 1, a data comparator 10 receives differential data signals READP and READM derived, for example, from the output of a magnetic read head in a disk drive. As will be apparent to one skilled in the art, the signals READP and READM indicate the occurrence of both positive and negative transitions or reversals of magnetic flux detected by the read head. In a commonly-used coding scheme, both positive and negative magnetic transitions correspond to a logic ONE, whereas the absence of a transition corresponds to a logic ZERO. At its outputs, the data comparator 10 provides a binary signal RAW DATA representing the serial read data. For reasons to be explained, the data comparator 10 also splits the data signal into odd and even portions, which appear as the signals RAW ODD and RAW EVEN respectively.

The basic timing unit of the various data signals shown in FIG. 1 is called the "cell"; it is the time during which a data signal is sampled to determine whether or not a pulse is present (i.e., whether or not a magnetic transition occurred). The presence of a pulse is denoted as a logic ONE; the absence as a logic ZERO. The signal RAW DATA is typically encoded according to a run-length limited code that constrains both the minimum and maximum spacing of pulses in the signal. For example, a 1,7 RLL code used by Digital Equipment Corporation's disk products dictates that there must be at least one and no more than seven ZEROs between two successive ONEs.

The signal RAW DATA is provided along with input signals REF CLOCK and REF SELECT to a multiplexer 12, which performs the function of selecting either RAW DATA or REF CLOCK as one of the inputs to a phase detector 14. The output of the phase detector 14 feeds a charge pump 16, which in turn feeds a loop filter 18. The output of the filter 18 is a control signal input to a voltage-controlled oscillator (VCO) 20, whose output is a VCO clock signal C2F running at twice the cell frequency of the signal RAW DATA. The signal C2F is fed to a divider 22 that derives additional clock signals CF and C2A. The signal CF is provided to the other input of the phase detector 14. An average zero phase start circuit 24 receives the signals RAW ODD, RAW EVEN, C2F, CF, and C2A, and provides to the VCO 20 a signal VCOSTP.

Although the term "VCO" literally denotes "voltage-controlled oscillator", it is to be understood that the term as used herein refers generally to oscillators whose frequencies are externally controllable, and in fact includes current-controlled and other variable-frequency oscillators. It will be apparent to those skilled in the art that the principles of the present invention are not dependent on the specific physical manner in which the frequency of the VCO is controlled.

An externally-generated signal ACQUIRE is also provided to the average zero phase start circuit 24 to indicate when it should begin operation to acquire phase-lock to the data signal. The signal ACQUIRE is described in greater detail below.

The phase detector 14, charge pump 16, filter 18, VCO 20, and divider 22 constitute a conventional phase-locked loop that is capable of phase locking to an input signal. Those skilled in the art will appreciate that the principles of the present invention are also applicable to other phase-locked loop structures. The signal REF SELECT is asserted during the interval preceding the acquisition of phase lock to the signal RAW DATA, so that during this interval the loop locks to the signal REF CLOCK. The frequency of the signal REF CLOCK is chosen to be approximately equal to the expected cell frequency of the signal RAW DATA, so that the VCO is brought close to its ultimate operating frequency.

While the multiplexer 12 therefore contributes to initializing the frequency of the VCO 20, the data comparator 10 and average zero phase start circuit 24 combine to initialize its phase. The average zero phase start circuit 24 measures the phase difference between pulses of the signals RAW ODD and RAW EVEN and corresponding clock pulses over a short interval at the beginning of acquisition, and asserts the signal VCOSTP long enough to compensate for the average phase error over that interval. As a result, both the frequency and phase of the VCO 20 are substantially the same as those of the signal RAW DATA when the phase locked loop begins to lock thereto.

During phase lock acquisition, the data pattern appearing on the signals READP and READM is a special recorded pattern known as a preamble. In the illustrated embodiment, the preamble employed is the cell pattern 1010 ... 10. The description to follow is specific to this preamble, particularly because of its 2-cell spacing between pulses. However, one skilled in the art will recognize from the following description that the principles of the invention may easily be extended to use with other preamble patterns, including without limitation the pattern 100100 ... 100 having 3-cell pulse spacing.

Figure 2:
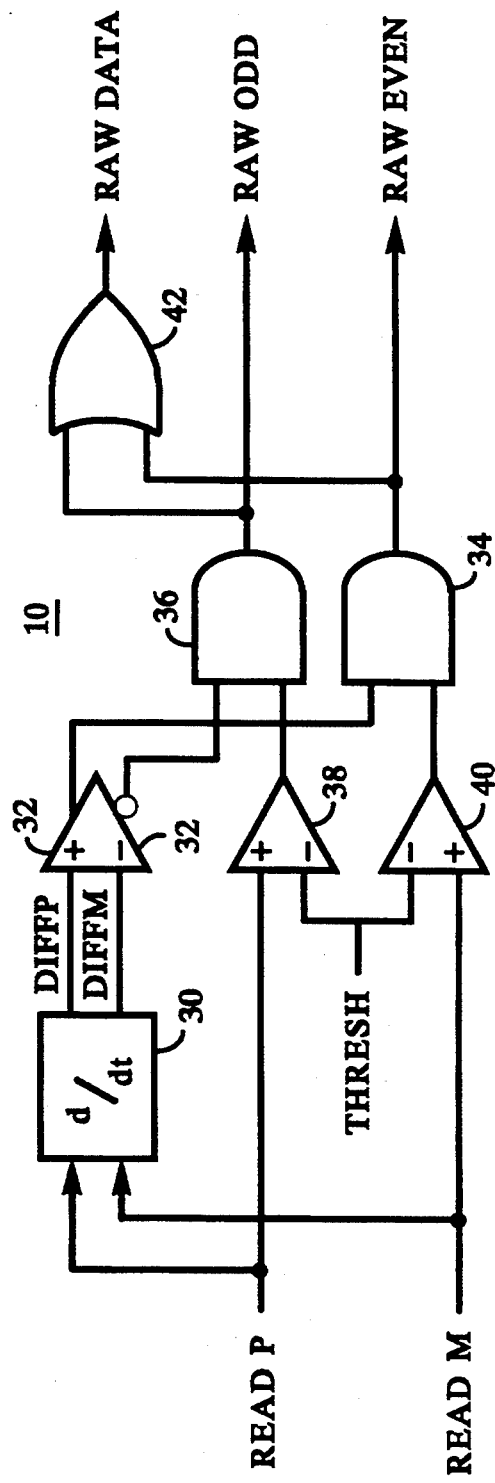
FIG. 2 is a schematic diagram of a data comparator in the phase locked loop of FIG. 1.

FIG. 2 shows the data comparator 10 of FIG. 1 in greater detail. A differentiator 30 receives the input signals READP and READM, and provides signals DIFFP and DIFFM indicating respectively the derivatives thereof. The signals DIFFP and DIFFM are provided to a comparator 32 having a non-inverted output wired to an input of an AND gate 34 and an inverted output wired to an input of another AND gate 36. The other inputs to the AND gates 36 and 34 come respectively from comparators 38 and 40. The non-inverting inputs of the comparators 38 and 40 respectively receive the signals READP and READM, while their inverting inputs are tied to a threshold signal THRESH that is set to a predetermined voltage. The appropriate voltage for the signal THRESH is determined in a known fashion based on characteristics of the data channel, in particular the average noise level.

The output of AND gate 36 is the output signal RAW ODD of FIG. 1, and that of AND gate 34 is the output signal RAW EVEN. These signals are also wired to the inputs of an OR gate 42, whose output is the output signal RAW DATA of FIG. 1.

It should be noted that the notations ODD and EVEN are merely labels attached arbitrarily to different halves of the data stream, and do not indicate any absolute position of pulses in the data stream. It should also be stressed that ODD and EVEN refer to pulses and not cells; therefore this labelling is equally valid for any preamble regardless of the number of cells between successive preamble pulses.

Figure 3:
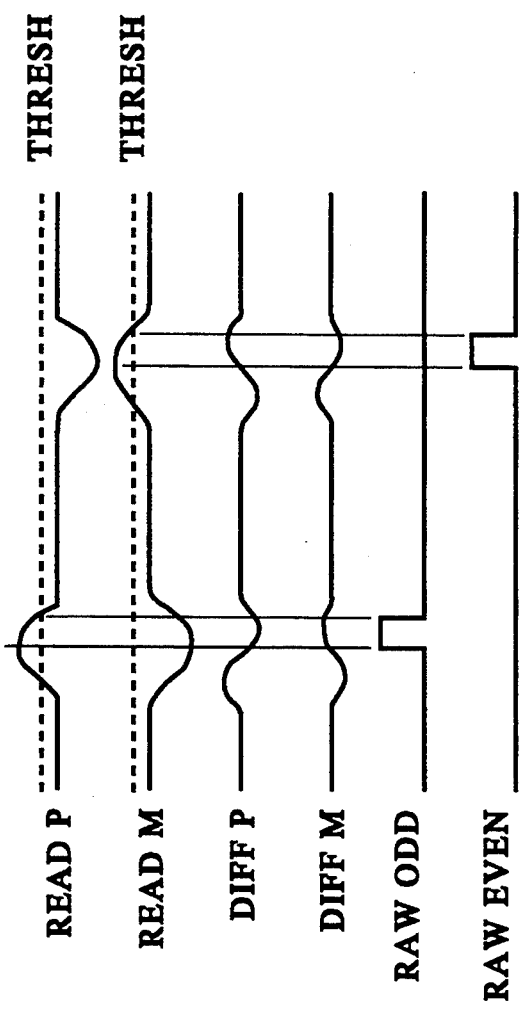
FIG. 3 is a timing diagram of various signals in the data comparator of FIG. 2.

FIG. 3 shows the timing of various signals in the data comparator 10. By employing the differentiator 30 and comparator 32, the leading edges of the pulses in the signals RAW ODD and RAW EVEN are made to align with the centers of the corresponding pulses of READP and READM as shown. As will be seen, it is the goal of subsequent phase locked loop activity to align these edges with the clocks generated by the VCO 20 of FIG. 1.

Figure 4:
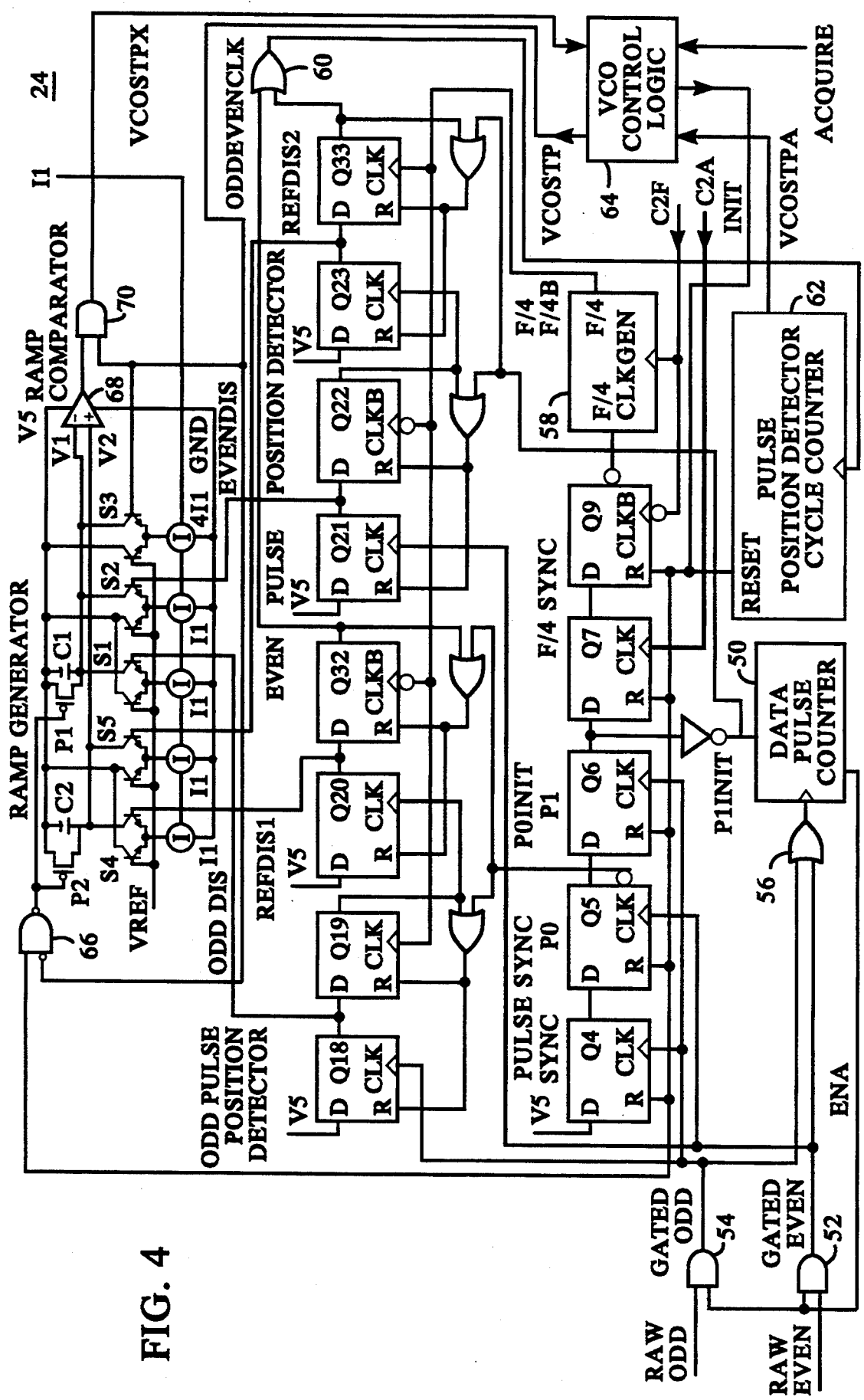
FIG. 4 is a schematic diagram of an average zero phase start circuit in the phase locked loop of FIG. 1.

FIG. 4 shows the average zero phase start circuit 24 of FIG. 1 in greater detail. A pair of AND gates 52, 54 receive the input signals RAW EVEN and RAW ODD, respectively, as well as a signal ENA from a data pulse counter 50. The output signals from the AND gates 52, 54 are signals denoted EVEN and ODD, respectively. These signals are fed to an OR gate 56 whose output is fed to the clock input of the data pulse counter 50.

A pulse synchronizer consisting of flip-flops Q4, Q5, and Q6 operates to ensure a known odd/even input pulse order at the beginning of operation. An F/4 synchronizer consisting of flip-flops Q7 and Q9 ensure that an F/4 clock generator 58 starts such that clock signals F/4 and F/4B are correctly aligned with the clocks C2F and C2A. The data pulse counter 50 counts the number of odd and even data pulses received from the data comparator 10 of FIG. 1, and provides a signal ENA to the AND gates 52, 54. In the illustrated embodiment, the data pulse counter 50 is configured to count 4 pulses, which could be any combination of odd and even pulses. The circuit of FIG. 4 will work correctly even if pulses are missing from the preamble signal.

Also shown in FIG. 4 is an odd pulse position detector consisting of flip-flops Q18, Q19, Q20, and Q32, and an even pulse position detector consisting of flip-flops Q21, Q22, Q23, and Q33. Note that the flip-flops Q19 and Q33 are clocked by the rising edge of the clock signal F/4, while the flip-flops Q32 and Q22 are clocked by the rising edge of F/4B. These pulse position detectors generate the signals ODD DIS and EVEN DIS whose pulse widths are dependent on the positions of pulses in the signals ODD and EVEN relative to the clock signal F/4. The pulse position detectors also generate the signals REFDIS1 and REFDIS2 which have constant pulse widths of ½ of an F/4 period.

The outputs of the flip-flops Q32 and Q33 are OR'd together by an OR gate 60, whose output drives the clock input of a pulse position detector cycle counter 62. This counter counts the number of complete pulse position detector cycles; after 4 cycles it asserts a signal VCOSTPA to VCO control logic 64 that stops the VCO 20 of FIG. 1 at cell center.

The output signals ODD DIS, EVEN DIS, REFDIS1 and REFDIS2 from the pulse position detectors are sent to ramp generator circuitry shown at the top of FIG. 4. A capacitor C1 whose voltage is labelled V1 is discharged through differential-pair switches S1, S2, and S3 by current-mirror current sources whose current output magnitudes are I1, I1 and (4 * I1) respectively. The switch S1 is controlled by the signal ODD DIS, S2 by the signal EVEN DIS, and S3 by the signal VCOSTP. Similarly, a capacitor C2 whose voltage is labelled V2 is discharged through differential-pair switches S4 and S5 by current sources whose current output magnitudes are both I1. The switch S4 is controlled by the signal REFDIS1, and S5 by the signal REFDIS2.

Generally, the current and capacitance values of the components shown in FIG. 4 should be selected to allow V1 and V2 a wide swing within the operating range of the circuit. This constraint is of course a function of the frequency range of the data signal. In the illustrated embodiment, the value of C1 is 15 pf., C2 is 10 pf., and I1 ranges over approximately 7 to 60 $\mu$A as the operating frequency CF ranges over 30 to 125 MHz. The current I1 provided to the current sources is conveniently obtained from conventional VCO tuning circuitry not shown in FIG. 4. It will be noted that the capacitance of the capacitor C1 is chosen to be 1.5 times greater than that of the capacitor C2 for reasons described below with reference to the operation of the circuit.

A NAND gate 66 drives a pair of PFET transistors P1 and P2 to initialize the voltages V1 and V2 respectively to a source voltage V5 equal to 5 volts.

The voltage signals V1 and V2 are applied to the inputs of a ramp comparator 68, whose output along with the signal VCOSTP is fed to an AND gate 70. The output of the AND gate 70 is a signal VCOSTPX that is routed to the VCO control logic 64.

The VCO control logic 64 controls the initialization, stopping and starting of the VCO 20 based on the signals ACQUIRE, VCOSTPA and VCOSTPX using conventional circuitry. These operations are more fully described below.

Figure 5:
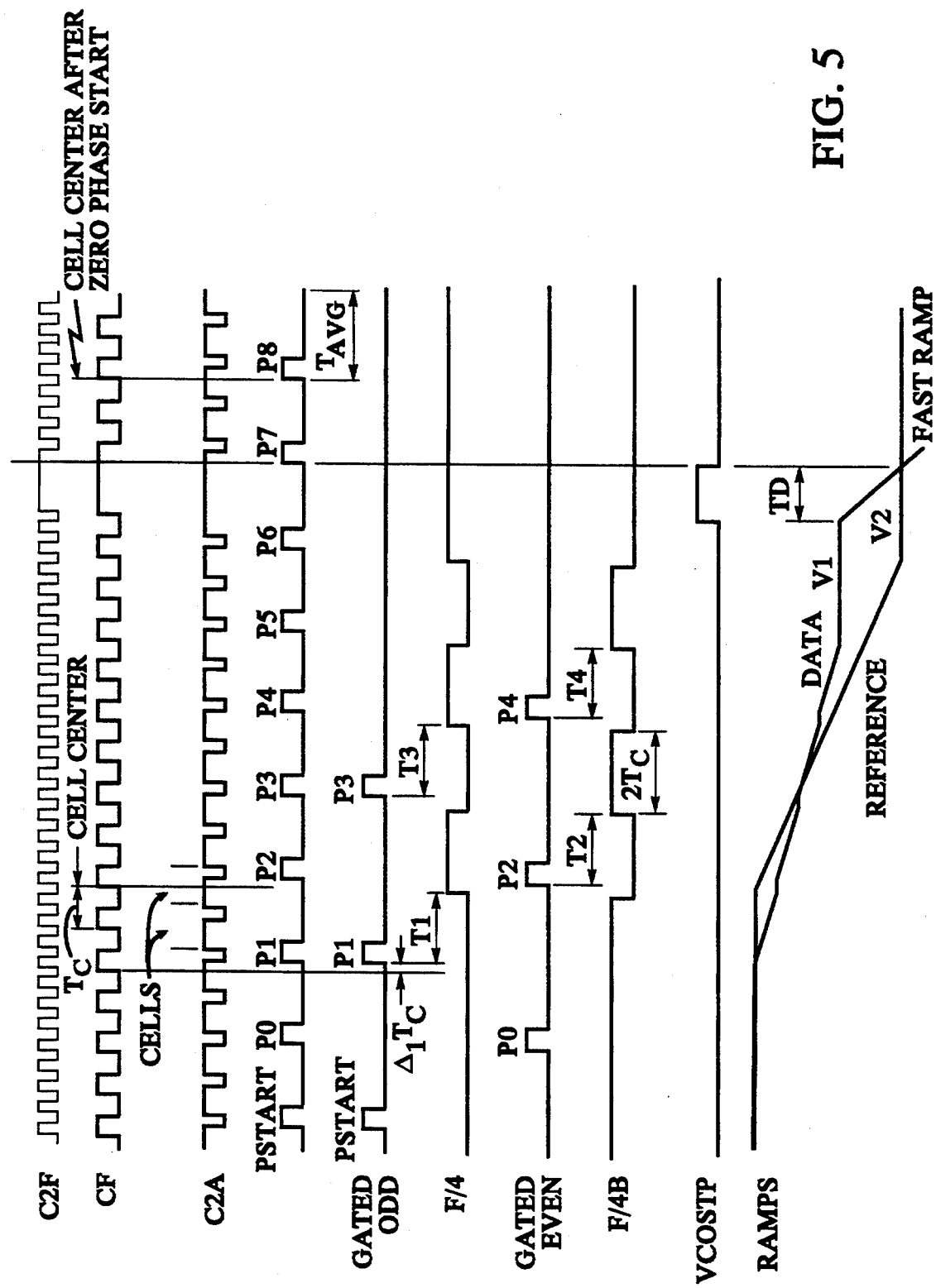
FIG. 5 is a timing diagram of various signals appearing in the average zero phase start circuit of FIG. 4.

Referring now to FIGS. 4 and 5, the operation of the average zero phase start circuit 24 will be described. Prior to the assertion of the signal ACQUIRE, a signal INIT is asserted by the VCO control logic 64. While the signal INIT is asserted, the counters 50 and 62 are held in an initialized state, the voltages V1 and V2 are held charged to V5, and the various flip-flops are held in a reset state.

When the signal ACQUIRE becomes asserted, the INIT signal is de-asserted, which allows the rest of the circuitry in FIG. 4 to begin operation. The first ODD pulse PSTART enables the pulse synchronizer by clocking a ONE into the flip-flop Q4. The next EVEN pulse P0 clocks the second stage Q5, thereby enabling the ODD pulse position detector. Therefore the second ODD pulse P1 starts the ODD pulse position detector by clocking the flip-flop Q18. It also clocks the flip-flop Q6, and thereby enables the data pulse counter, the F/4 synchronizer, and the EVEN pulse position detector.

When the flip-flop Q18 in the ODD pulse position detector is clocked, the signal ODD DIS becomes asserted, which results in the discharging of the capacitor C1 through switch S1. Meanwhile, the F/4 clock generator 58 starts up with a rising edge of the clock signal F/4 at cell center one and a half cell times (1.5 T$_c$) after the flip-flop Q7 is clocked high by the clock C2A. This rising edge of the clock signal F/4 resets the ODD pulse position detector, turning off the switch S1. The duration of the first pulse of the signal ODD DIS is T1, and the resulting voltage V1 on the capacitor C1 is:

$$V1 = (I1 * T1)/C1$$

which is proportional to the time from the leading edge of the pulse P1 to the corresponding rising edge of the clock signal F/4. Since the F/4 clock generator 58 is started 1.5 cell times after the flip/flop Q7 is clocked high, the time T1 could be as short as 1.5 * $T_c$ if the output of the flip/flop Q5 goes high just prior to a rising edge of the clock C2A, and could be as long as 2.5 * $T_c$ if the output of the flip/flop Q5 goes high just after a rising edge of the clock C2A. Therefore the time T1 has the following range:

$$(1.5*T_c) < T1 < (2.5*T_c)$$

Or, written another way:

$$T1 = 2T_c(1 + \Delta_1/2)$$

where $\Delta_1$ represents the phase difference as a fraction of $T_c$ between the edge of pulse P1 and a cell center 2 cells before the edge of the clock signal F/4, and where $-0.5 < \Delta_1 < 0.5$.

This rising edge of the clock signal F/4 also enables the ODD reference ramp via flip-flop Q20, discharging the capacitor C2 with a current I1 via switch S4. The rising edge of the clock signal F/4B then disables the ODD reference ramp, and clocks the pulse position detector cycle counter 62 through OR gate 50. The time between enabling and disabling the ODD reference ramp is always 2 * $T_c$, or ½ of an F/4 cycle. The voltage V2 is therefore given by:

$$V2 = (I1*2*T_c)/C2$$

The EVEN pulse position detector and ramp generation circuitry operate the same way as the ODD circuits, except of course that they operate only on EVEN pulses. Of particular note is that the ODD and EVEN data and reference ramps operate completely independently, enabling accurate timing measurements even in the case of overlapping discharge pulses or missing input pulses.

At the end of the last reference ramp following the pulse P4, the pulse position detector cycle counter 62 asserts the signal VCOSTPA. This is synchronized by the VCO control logic 64 to assert the signal VCOSTP at cell center. The VCO 20 of FIG. 1 is stopped at this point. The assertion of the signal VCOSTP turns on switch S3 to enable discharging of the capacitor C1 with a current of 4 * I1. The comparator 68 detects when V1 crosses V2, and switches the signal VCOSTPX high. This restarts the VCO 20 of FIG. 1 and also places the average zero phase start circuitry back in its initialized state.

While FIG. 5 shows the operation of the average zero phase start circuitry in the absence of noise and missing pulses, operation of the circuit of FIG. 4 under such circumstances will be apparent to those skilled in the art.

It should be noted that the phase locked loop of FIG. 1 must be carefully switched between the reference clock and the data signal. In particular, it is important to switch synchronously so that no spurious unnecessary phase corrections are introduced. Also, the phase locked loop should no longer follow the reference clock after the VCO 20 is re-started. If this were to happen, there would be undesirable phase corrections based on the reference clock that would interfere with locking to the data signal. These concerns are common to many zero phase start schemes, and suitable techniques to address them are known in the art.

A detailed mathematical analysis is now presented to explain how the circuit of FIG. 4 obtains the desired result of phase-aligning the data with the clocks. In the following equations, an average time uncertainty $\Delta_{ave}$ is given by $\Delta_{ave} = (\Delta_1 + \Delta_2 + \Delta_3 + \Delta_4)/4$, where $\Delta_i$ is the fractional phase difference between pulse $P_i$ and a corresponding cell center, as described above.

When the signal VCOSTPA switches high, the two voltages V1 and V2 are given by:

$$V1 = (4*I1*2T_c(1 + \Delta_{ave}/2))/C1 \text{ and}$$

$$V2 = (4*I1*2T_c)/C2$$

The VCO hold-off time $T_d$, shown in FIG. 5 as the time during which the VCO is stopped while the fast ramp occurs, is given by $$\begin{aligned} T_d &= ((V2 - V1) * C1)/4I1 \\ &= C1/4I1 * [(4I1/C2 * 2T_c) - \\ & \quad (4I1/C1 * 2T_c(1 + \Delta_{ave}/2))] \\ &= 2T_c * ((C1/C2) - 1 - \Delta_{ave}/2) \end{aligned}$$

To keep the VCO hold-off time $T_d$ positive, C1 should be at least 1.25 times C2. It is also desirable to minimize the hold-off time to minimize the associated acquisition delay. A preferred ratio is C1 = 1.5 * C2, which yields:

$$T_d = 2T_c*(1.5 - 1 - \Delta_{ave}/2)$$

$$T_d = T_c*(1 - \Delta_{ave})$$

Thus the clocks are stopped by one cell time minus $\Delta_{ave}T_c$, resulting in the desired alignment of the data with the clock signal F/4.

While the invention has been described with reference to particular embodiments thereof, it will be clear to those skilled in the art that alternative embodiments exist within its spirit and scope. In particular, it may be unnecessary or undesirable in some embodiments to split the data stream into odd and even portions; such embodiments may of course use a single feature wherever multiple features are shown to accommodate the odd/even split. The exact number of pulses over which averaging occurs, in this embodiment 4, may also be changed. As mentioned, it is preferred to keep this number even to minimize the effect of pulse pairing noise; however it may be advantageous to dispense with even this requirement in alternative embodiments. The exact values and configuration of circuit components may similarly be altered in a manner readily apparent to those skilled in the art to accommodate different data signal frequencies, supply voltages, and other operating constraints.

Also, as has been noted, the invention may be practiced with preambles other than 1010 . . . 10. The major change required to accommodate different preambles is to generate suitable equivalents of the F/4 clocks so that the pulse-to-clock correspondence is coherent. All these and other embodiments are intended to be included within the scope of the following claims.

What is claimed is:

1. A method of locking a phase locked loop to a data signal having a predetermined sequence of preamble pulses, comprising the steps of:

splitting the preamble pulses of the data signal into odd preamble pulses and even preamble pulses, setting the frequency of clock pulses generated by a voltage-controlled oscillator (VCO) within said phase locked loop to approximately the frequency of the data signal to which said VCO will subsequently be phase locked;

detecting a phase difference between each of the odd preamble pulses and a corresponding odd clock pulse of said VCO, and detecting a phase difference between each of the even preamble pulses and a corresponding even clock pulse of said VCO to provide a plurality of detected phase differences;

determining an average phase difference value from the plurality of detected phase differences;

phase-shifting the clock pulses generated by said VCO by an amount corresponding to the average phase difference value to bring said VCO clock pulses into a predetermined initial phase relationship with the preamble pulses of said data signal; and phase locking said VCO to said data signal after said VCO clock pulses have been phase-shifted.

2. A method according to claim 1, wherein said detecting step comprises the step of detecting the phase difference between each of an even number of odd and even preamble pulses of said data signal and corresponding clock pulses of said VCO clock signal.

3. A method according to claim 3, wherein said detecting step comprises the step of detecting the phase difference between each of four odd and even preamble pulses of said data signal and corresponding clock pulses of said VCO.

4. A method according to claim 1, wherein said setting step comprises the step of phase-locking said VCO to a reference clock signal whose frequency is equal to a nominal frequency of said data signal.

5. A method according to claim 1, wherein said phase-shifting step comprises the step of stopping said VCO from generating clock pulses for a duration related to the average phase difference value and thereupon restarting said VCO to bring said VCO clock pulses into the predetermined phase alignment relationship with the preamble pulses of the data signal.

* * * * *